(12) United States Patent
Wang et al.

(10) Patent No.: US 6,210,196 B1
(45) Date of Patent: Apr. 3, 2001

(54) ELECTRICAL CONNECTOR

(75) Inventors: Jwo-Min Wang, Hsin Tien; Ming-Lun Szu, Taipei, both of (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/330,393

(22) Filed: Jun. 11, 1999

(30) Foreign Application Priority Data

Nov. 20, 1998 (TW) ................................................ 87219263

(51) Int. Cl.[7] .................................................. H01R 13/625
(52) U.S. Cl. ............................................................ 439/342
(58) Field of Search .................................. 439/342, 331, 439/259, 330, 263, 264, 265, 266

(56) References Cited

U.S. PATENT DOCUMENTS 5,489,218 * 2/1996 McHugh ................................ 439/342
5,492,488 * 2/1996 Hsu ....................................... 439/342
5,562,474 * 10/1996 Lee ....................................... 439/342

* cited by examiner

*Primary Examiner*—Neil Abrams
*Assistant Examiner*—J. F. Duverne
(74) *Attorney, Agent, or Firm*—Wei Te Chung

(57) ABSTRACT

A ZIF socket connector includes a base defining a plurality of pin receiving holes and a cover slidably positioned on the base and defining a plurality of through holes corresponding to the pin receiving holes. Conductive pins of a chip to be mounted on the connector extend through the through holes of the cover and into the pin receiving holes of the base. Each pin receiving hole has a conductive terminal fixed therein. Each terminal has a resilient arm imparting a transverse engaging force on the corresponding pin upon engaging therewith. Some of the terminals are fixed to a first inside face of the pin receiving holes, while the remaining terminals are located at an opposite second inside face of the pin receiving holes whereby the transverse engaging forces acting on the two groups of pin receiving holes are opposite to and thus cancelled by each other.

5 Claims, 9 Drawing Sheets

ELECTRICAL CONNECTOR

BACKGROUND OF THE INVENTION

1. Field of the Invention

The present invention generally relates to an electrical connector, and in particular to a ZIF (zero insertion force) socket connector having a force-balanced structure for eliminating a transverse engaging force acting upon a chip mounted on the socket connector.

2. The Prior Art

Socket connectors for mounting electronic chips to a circuit board are well-known in the electronics field. The socket connector defines a plurality of holes for fixedly receiving conductive terminals therein. The chip has a plurality of conductive pins extending into the holes and electrically engaging with the terminals. Mechanical engagement is formed between the pins of the chip and the terminals of the socket to secure the chip to the socket. The mechanical engagement, however, inflicts damage on the pins and the terminals caused by abrasion therebetween when inserting the pins into the holes.

A zero insertion force (ZIF) socket connector overcomes the abrasion problem by inserting the pins into the holes of the socket connector such that the pins do not initially engage the terminals whereby abrasion during insertion is prevented. The chip is then moved transversely to bring the pins into engagement with the terminals. Examples of ZIF socket connectors are disclosed in Taiwan Patent Publication Nos. 85218817 and 83208396 and U.S. Pat. Nos. 5,492,488 and 5,562,474.

The transverse movement of the chip, however, imparts a transverse engaging force on the pins during engagement with inclined resilient arms of the terminals leading to an unbalanced force and resulting in mechanical and electrical instability between the chip and the connector.

FIG. 1 shows a conventional ZIF socket connector comprising a socket base 62 defining holes 621 therein for accommodating conductive terminals 63. A cover 61 is slidably positioned on the base 62. The cover 61 also defines holes 611 therein corresponding to the holes 621 of the base 62. A lever 64 is rotatably mounted to the base 62 and engages with the cover 61 to shift the cover 61 with respect to the base 62.

Each hole 621 of the base 62 has an expanded opening as shown in FIG. 2. The expanded opening allows a corresponding pin 7 of a chip to be inserted therein with substantially zero insertion force (FIGS. 3A and 3B). By actuating the lever 64, the cover 61 is moved relative to the base 62 thereby driving the pins 7 to move toward and engage with inclined resilient arms 631 of the corresponding terminals 63 (FIGS. 3C and 3D). During this process, the arm 631 is deformed and imparts a transverse engaging force on the pin 7.

Conventionally, the engaging forces of all the pins 7 of the chip are in the same direction which causes a transverse offset of the chip with respect to the socket 62 leading to undesired frictional engagement between the pins 7 and inner walls 6211 of the holes 621 of the socket 62. An additional resistance to the movement of the cover 61 is formed and an excessive force is required to achieve the desired engagement between the pins 7 and the terminals 63. Such an excessive force may damage the socket 62 and the pins 7. As a consequence, unstable mechanical and electrical engagement may result.

SUMMARY OF THE INVENTION

Accordingly, an object of the present invention is to provide a ZIF socket connector having a force-balanced configuration.

Another object of the present invention is to provide a ZIF socket connector for engaging with a chip wherein smooth engagement between pins of the chip and terminals of the socket may be obtained with minimal frictional force therebetween.

A further object of the present invention is to provide a ZIF socket connector for engaging with a chip wherein the likelihood of damage being incurred on the socket and pins of the chip caused by an excessive force during engagement is minimized.

To achieve the above objects, an electrical connector in accordance with the present invention comprises a base defining a plurality of pin receiving holes and a cover slidably positioned on the base and defining a plurality of through holes corresponding to the pin receiving holes. Conductive pins of a chip to be mounted on the connector extend through the through holes of the cover and into the pin receiving holes of the base. Each pin receiving hole has a conductive terminal fixed therein. Each terminal has a resilient arm imparting a transverse engaging force on the corresponding pin upon engaging therewith. Some of the terminals are fixed to a first inside face of the pin receiving holes, while the remaining terminals are located at an opposite second inside face of the pin receiving holes whereby the transverse engaging forces acting on the two groups of pin receiving holes are opposite to and thus effectively cancelled by each other.

BRIEF DESCRIPTION OF THE DRAWINGS

The present invention will be apparent to those skilled in the art by reading the following description of preferred embodiments thereof, with reference to the accompanying drawings, in which.

DETAILED DESCRIPTION OF THE PREFERRED EMBODIMENTS

Figure 1:
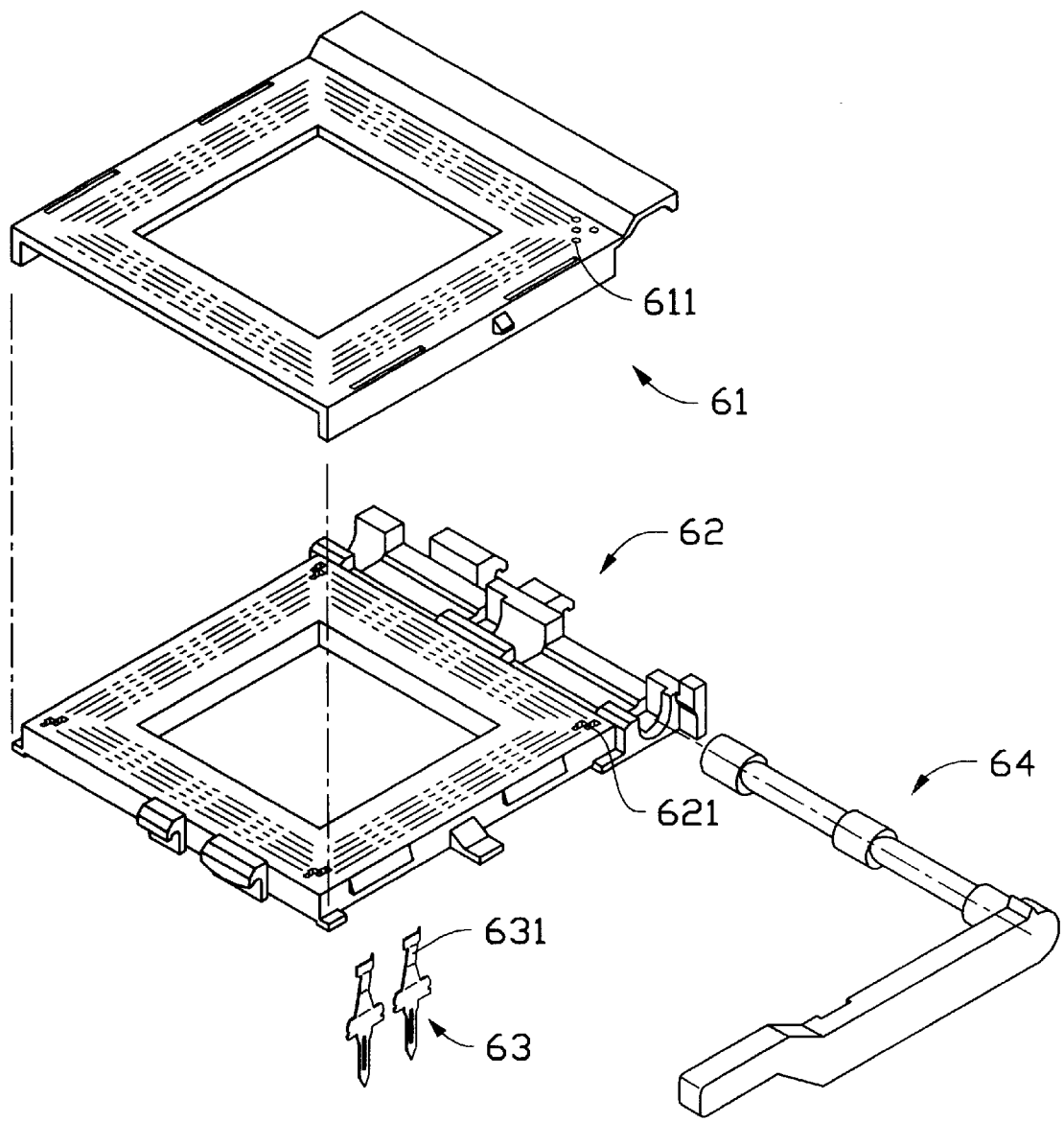
FIG. 1 is an exploded view of a prior art ZIF socket connector.
Figure 2:
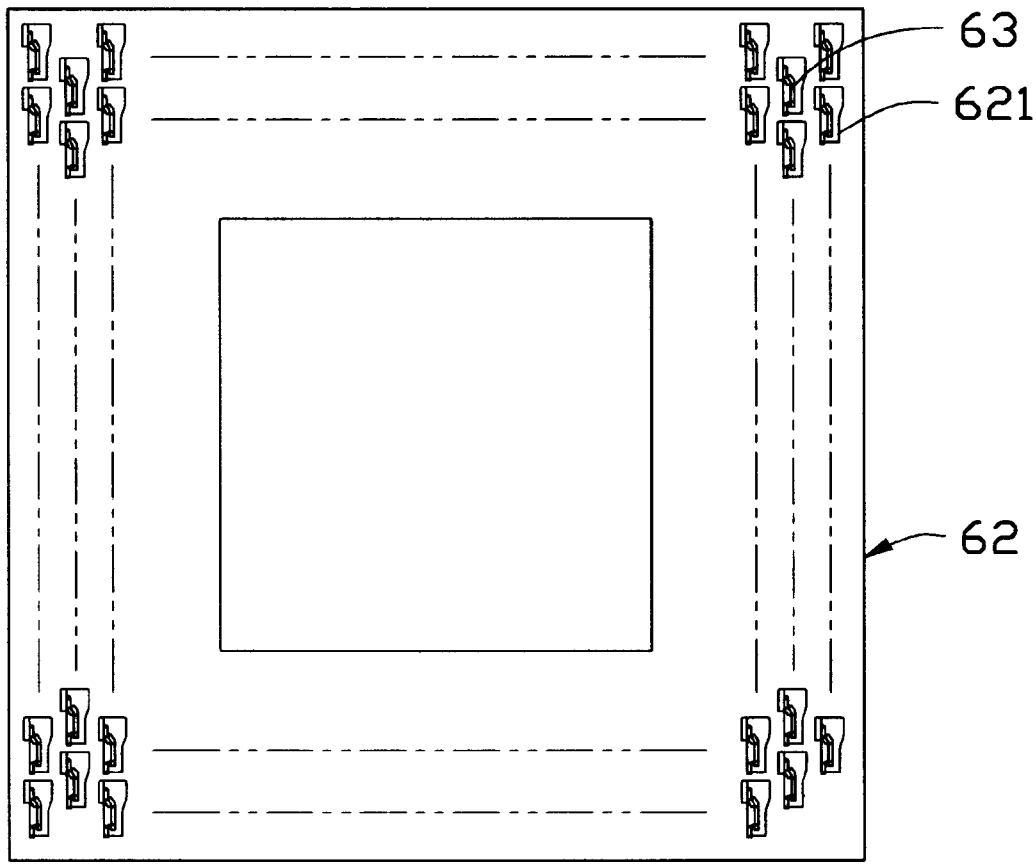
FIG. 2 is a top view of the socket base of the prior art ZIF socket connector with a lever removed therefrom.
Figure 3A:
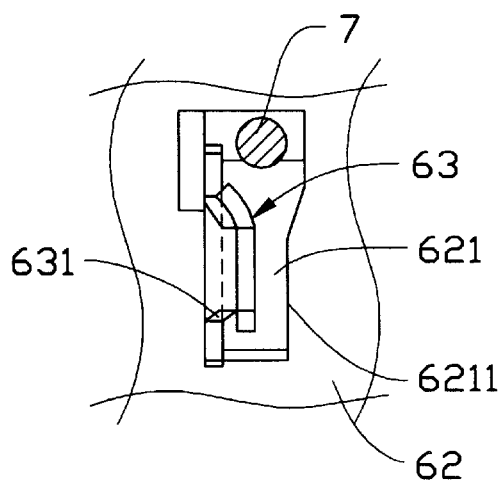
FIG. 3A is a top view of a portion of a socket base of the prior art socket connector showing a pin receiving hole in which a socket terminal is fixed and a pin of a chip being initially inserted into the hole.
Figure 3C:
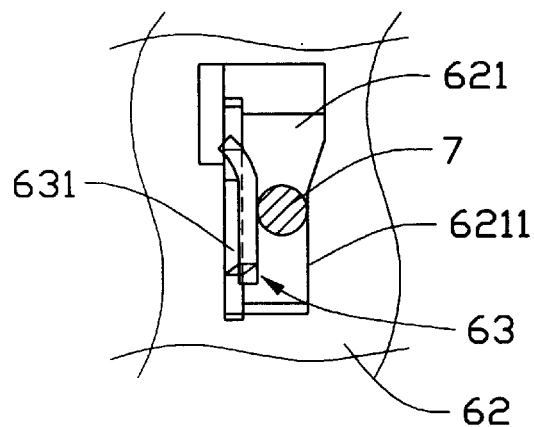
FIG. 3C is a top view of a portion of the socket base of the prior art socket connector showing the pin receiving hole with the socket terminal fixed therein and the pin of the chip engaging with the socket terminal.
Figure 3B:
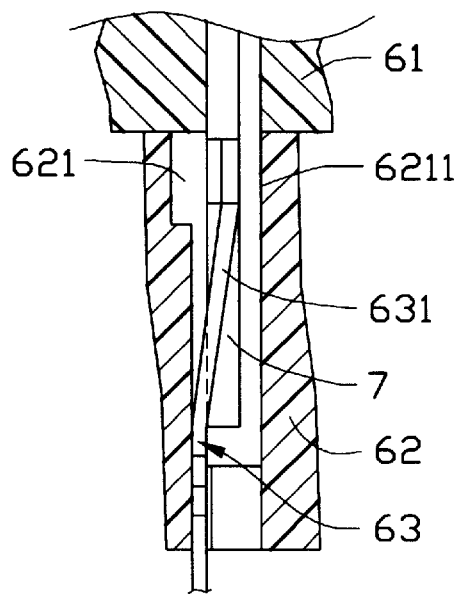
FIG. 3B is a cross-sectional view of FIG. 3A.
Figure 3D:
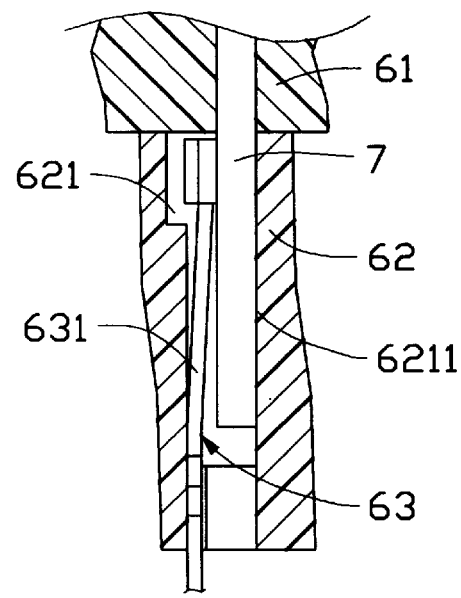
FIG. 3D is a cross-sectional view of FIG. 3C.
Figure 4:
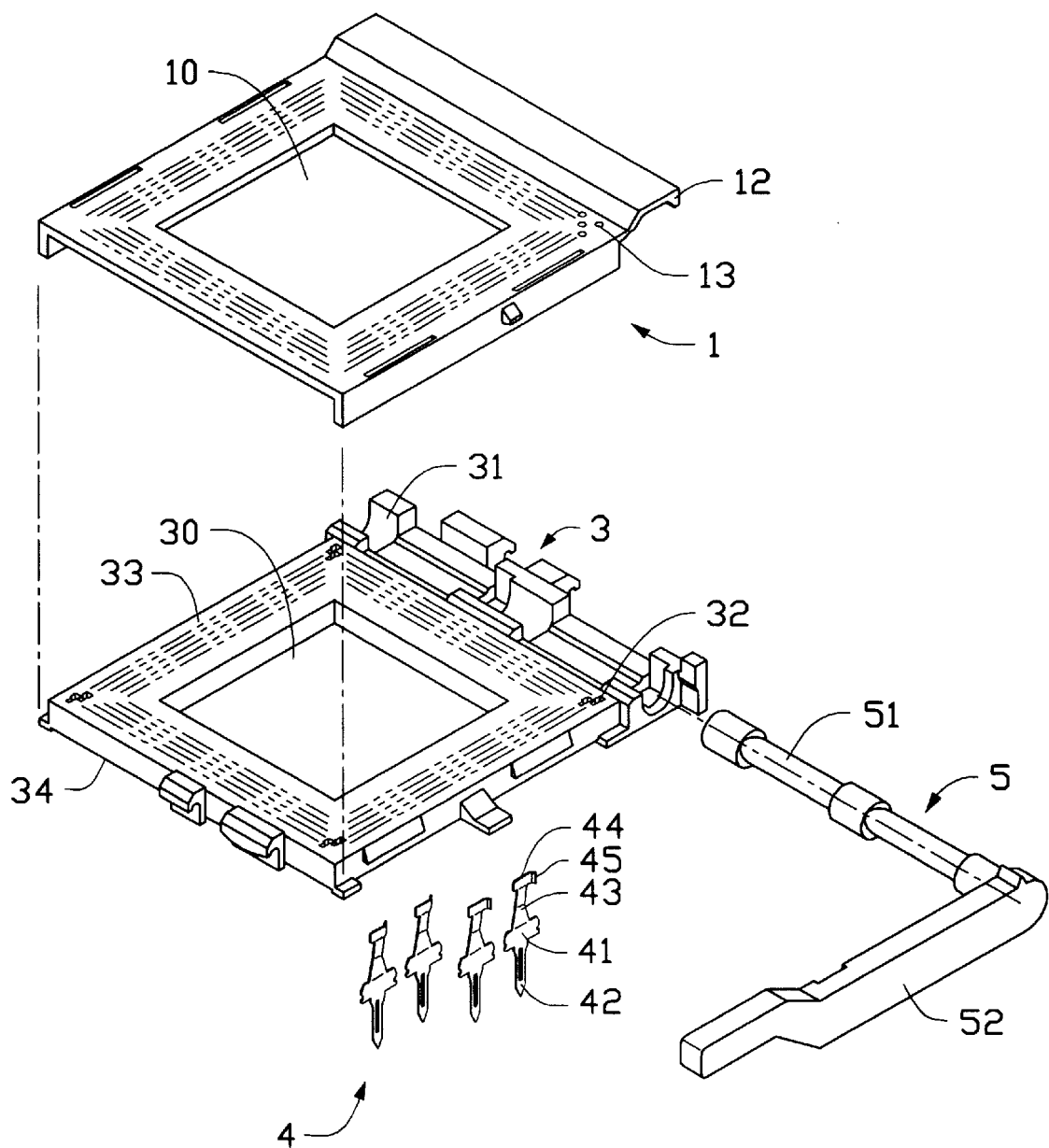
FIG. 4 is an exploded view of a ZIF socket connector constructed in accordance with a first embodiment of the present invention.

Referring to the drawings and in particular to FIG. 4, an electrical connector in accordance with the present invention comprises a base 3 and a cover 1 slidably positioned on a top face 33 of the base 3. A lever 5 is mounted to the base 3 and engages with the cover 1 to move the cover 1 relative to the base 3. The lever 5 comprises a shaft 51 rotatably supported in bearing recesses 31 formed on the base 3 and held in position by a retaining flange 12 formed on the cover 1. The lever 5 comprises an arm 52 extending from the shaft 51 whereby the shaft 51 is rotated by the arm 52 to have an outer contour of a driving section thereof engaging with and driving the cover 1 to move with respect to the base 3.

The cover 1 comprises a rectangular plate defining a plurality of through holes 13 therein. The through holes 13 are arranged in a matrix and form a plurality of rows. The through holes 13 of adjacent rows are staggered with respect to each other. In the embodiment illustrated, a central opening 10 is defined in the cover 1 and the rows of the through holes 13 surround the central opening 10.

Figure 5A:
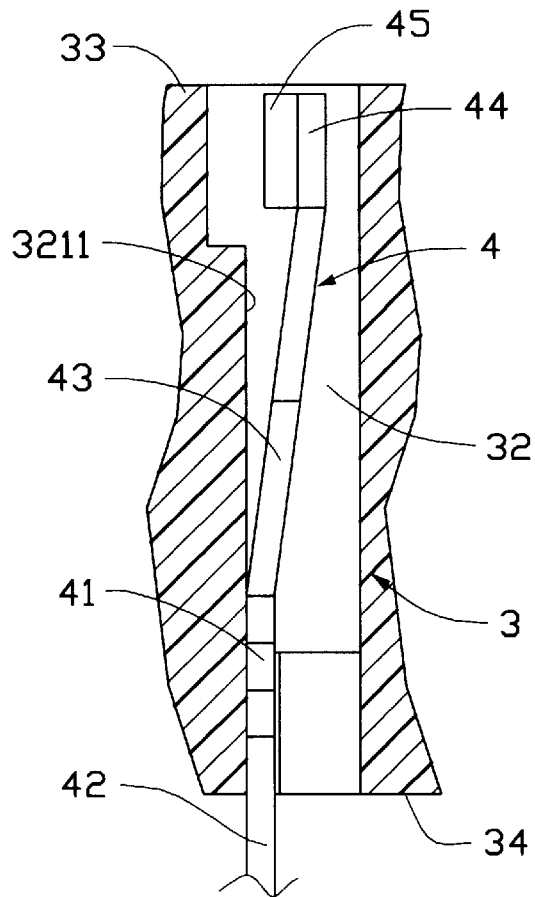
FIG. 5A is a cross-sectional view of a portion of a socket base of the connector of the present invention showing the arrangement of a socket terminal in a pin receiving hole thereof.
Figure 5B:
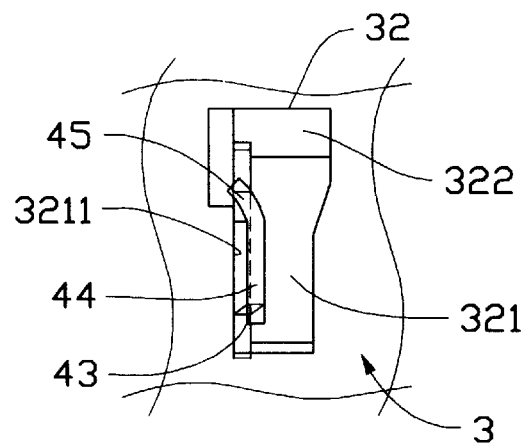
FIG. 5B is a top view of FIG. 5A.
Figure 7A:
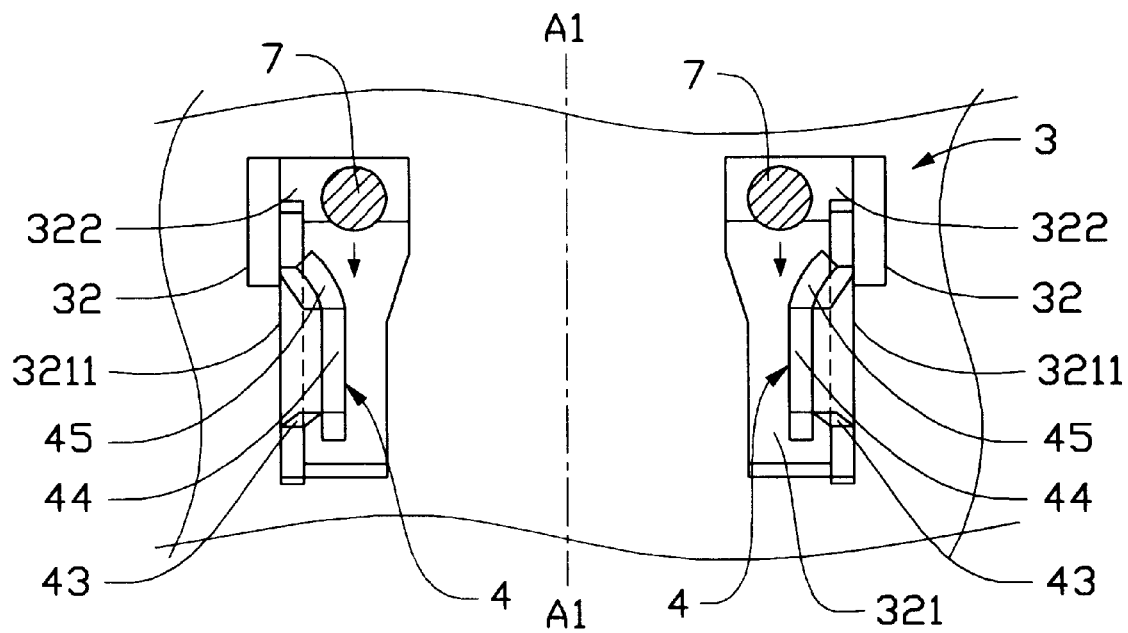
FIG. 7A is a top view of a portion of the socket base showing the position of the pins of the chip after initial insertion into the pin receiving holes of the socket base.
Figure 7B:
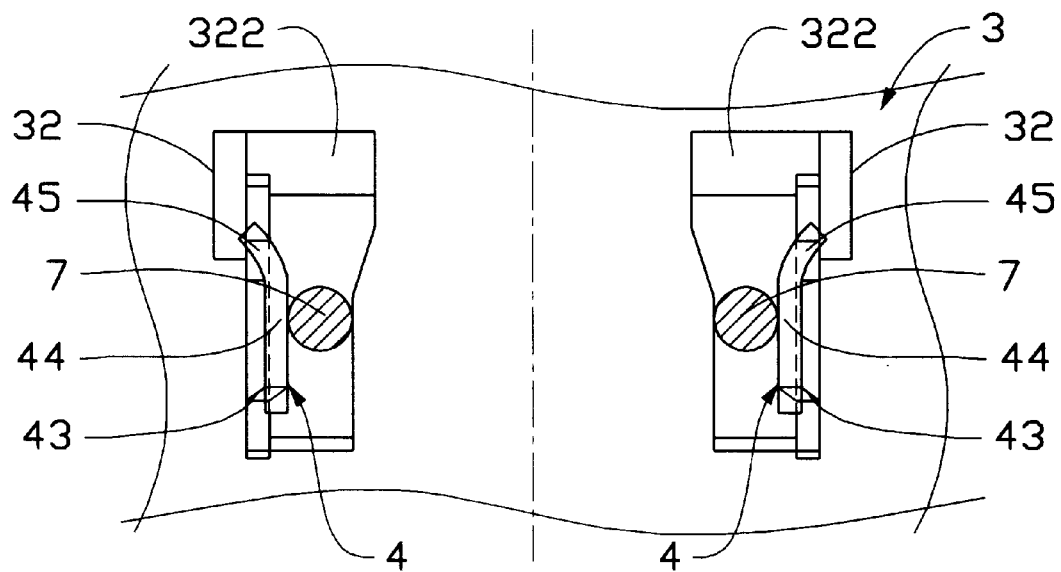
FIG. 7B is similar to FIG. 7A showing the pins of the chip engaging with the socket terminals of the socket base.

Also referring to FIGS. 5A and 5B, the base 3 has a rectangular configuration corresponding to the cover 1 with a central opening 30 corresponding to the central opening 10 of the cover 1 defined therein. A matrix of pin receiving holes 32 is arranged in the top face 33 of the base 3 forming rows around the central opening 30. The pin receiving holes 32 correspond to the through holes 13 of the cover 1 for receiving pins 7 (FIGS. 7A and 7B) of a chip (not shown) to be mounted to the connector via the corresponding through holes 13. The pin receiving holes 32 of adjacent rows are also staggered with respect to each other.

Each pin receiving hole 32 has a reduced section 321 and an expanded section 322 defining a passageway (not labeled) for insertion of the pin 7. The expanded section 322 is initially in alignment with the corresponding through hole 13 of the cover 1 and is dimensioned to be larger than the pin 7 whereby the pin 7 can be inserted without resistance and while freely move therein. The pin 7 is moved into the corresponding reduced section 321 via the passageway by actuating the lever 5 which drives the cover 1 to move relative to the base 3.

Each terminal 4 comprises a securing section 41 fixed in the pin receiving hole 32 and positioned against one inside face thereof. A board mounting section 42 extends from the securing section 41 and beyond a bottom face 34 of the base 3 for mounting to and electrically engaging with a circuit board (not shown). A resilient section 43 extends from the securing section 41 toward the top face 33 of the base 3 in an inclined direction and supports a pin engaging section 44 thereon which extends in a direction substantially normal to the resilient section 43 and has an inclined free end 45.

The terminal 4 is positioned in the reduced section 321 of the pin receiving hole 32. When the pin 7 is driven by the lever 5, the pin 7 is moved to contact the inclined free end 45 and is guided thereby to engage with the engaging section 44 of the terminal 4. The resilient section 43 is deformed and imparts a transverse engaging force on the pin 7 by means of the engaging section 44 whereby a tight engagement is formed therebetween.

Figure 6:
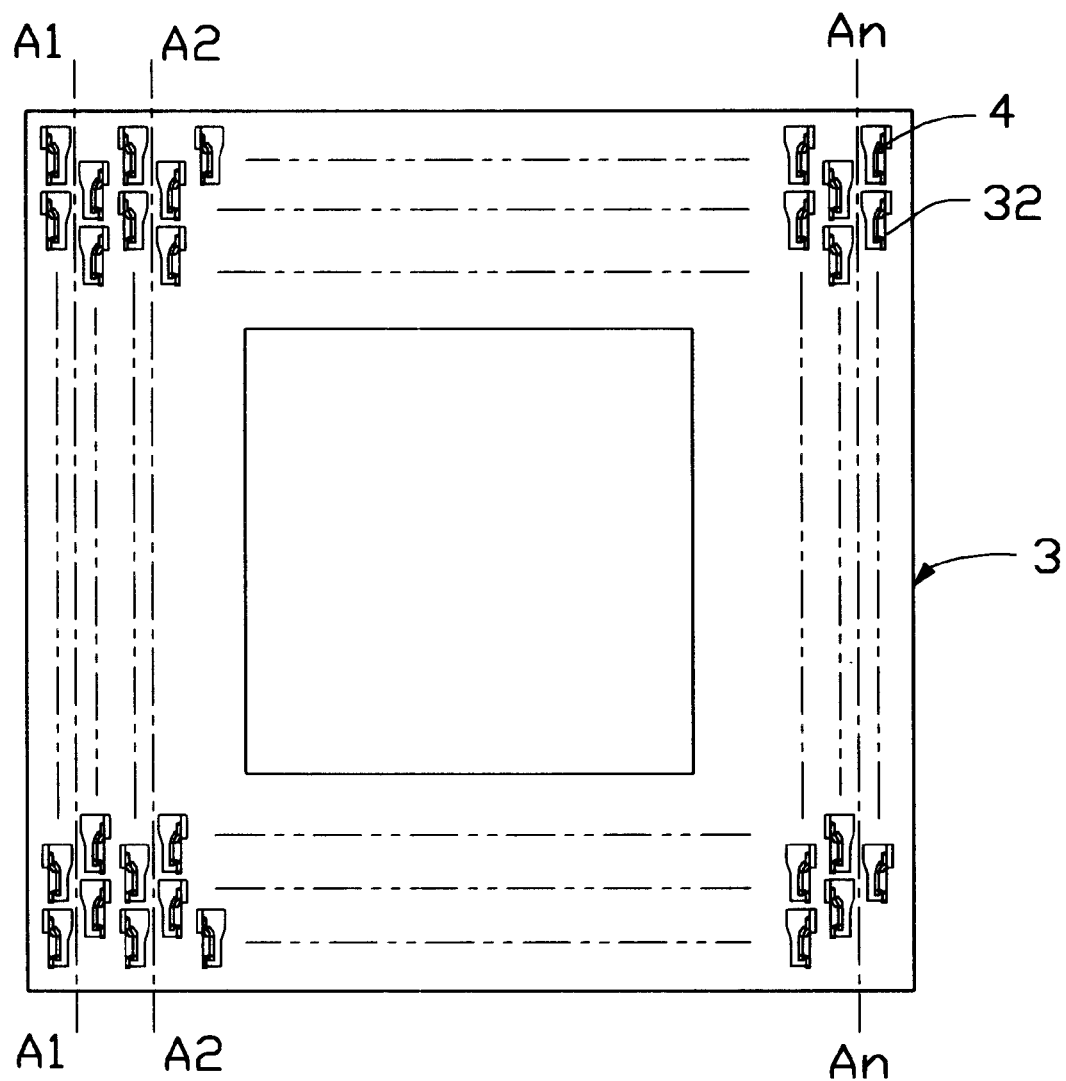
FIG. 6 is a top view of the socket base of the connector of the present invention with a lever removed therefrom.

With reference to FIG. 6, adjacent rows of the pin receiving holes 2 are arranged on opposite sides of a base reference line A1, A2, . . . , An along a direction of movement of the cover 1 with respect to the base 3. The adjacent rows of pin receiving holes 32 and the terminals 4 received therein are arranged to have a symmetrical orientation with respect to the corresponding base reference line A1, A2, . . . , An, as particularly shown in FIGS. 7A and 7B. In other words, the terminals 4 of adjacent rows of pin receiving holes 32 are located at sides thereof distanced from the base reference line A1 and positioned against a remote inside face 3211 of the pin receiving holes 32 and the resilient section 43 and engaging section 44 are inclined toward the base reference line A1. Thus, the transverse engaging forces acting upon the pins 7 by the resilient sections 43 of the terminals 4 counteract each other thereby substantially eliminating the transverse force acting upon the cover 1 and the chip.

Figure 8:
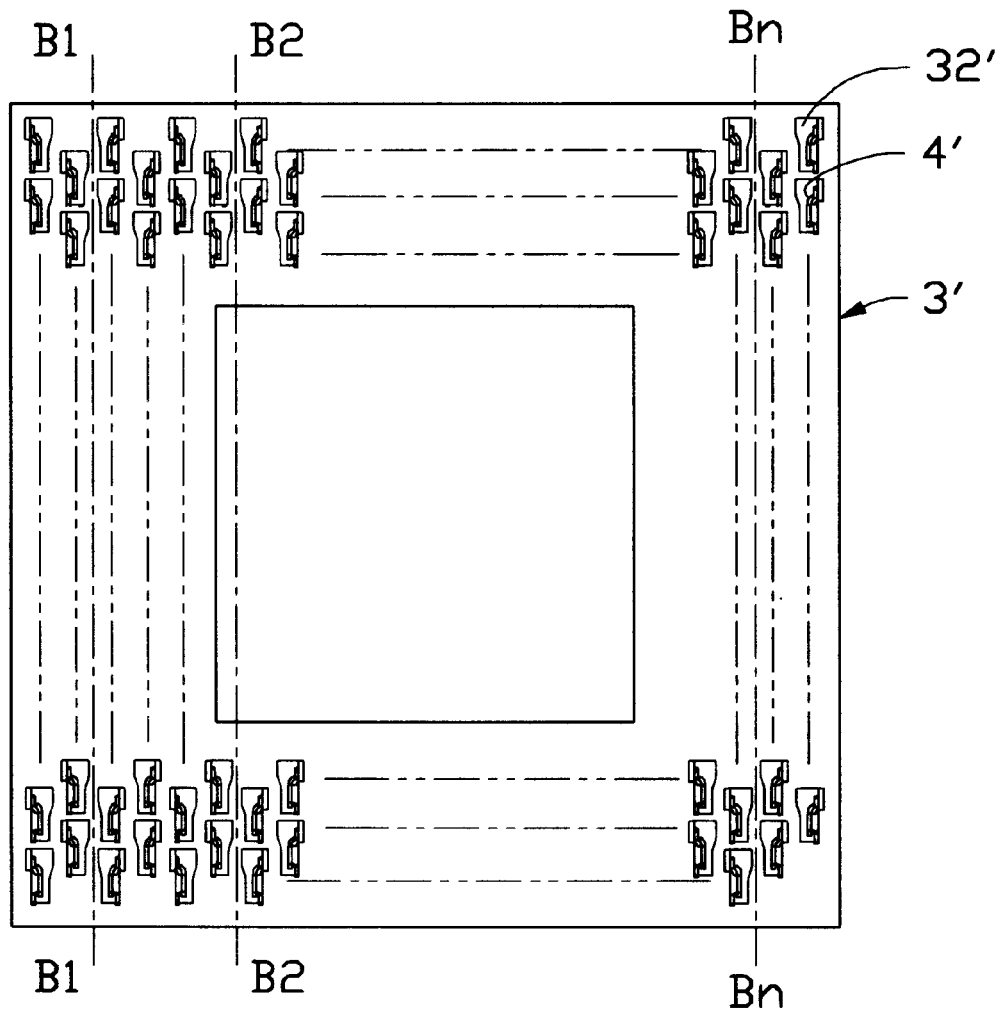
FIG. 8 is a top view of a socket base of a connector constructed in accordance with a second embodiment of the present invention.

FIG. 8 shows a second embodiment of the present invention, wherein the base of the connector which is now designated by reference numeral 3' has base reference lines B1, B2, . . . , Bn each having two rows of pin receiving holes 32' arranged on opposite sides thereof for receiving terminals 4' therein. The four rows of pin receiving holes 32' and the terminals 4' received therein are arranged to have a symmetrical orientation with respect to the corresponding base reference line B1, B2, . . . , Bn. Thus, the transverse engaging forces acting upon the pins 7 by the terminals '4 counteract each other thereby substantially eliminating the transverse force acting upon the cover 1 and the chip.

Figure 9:
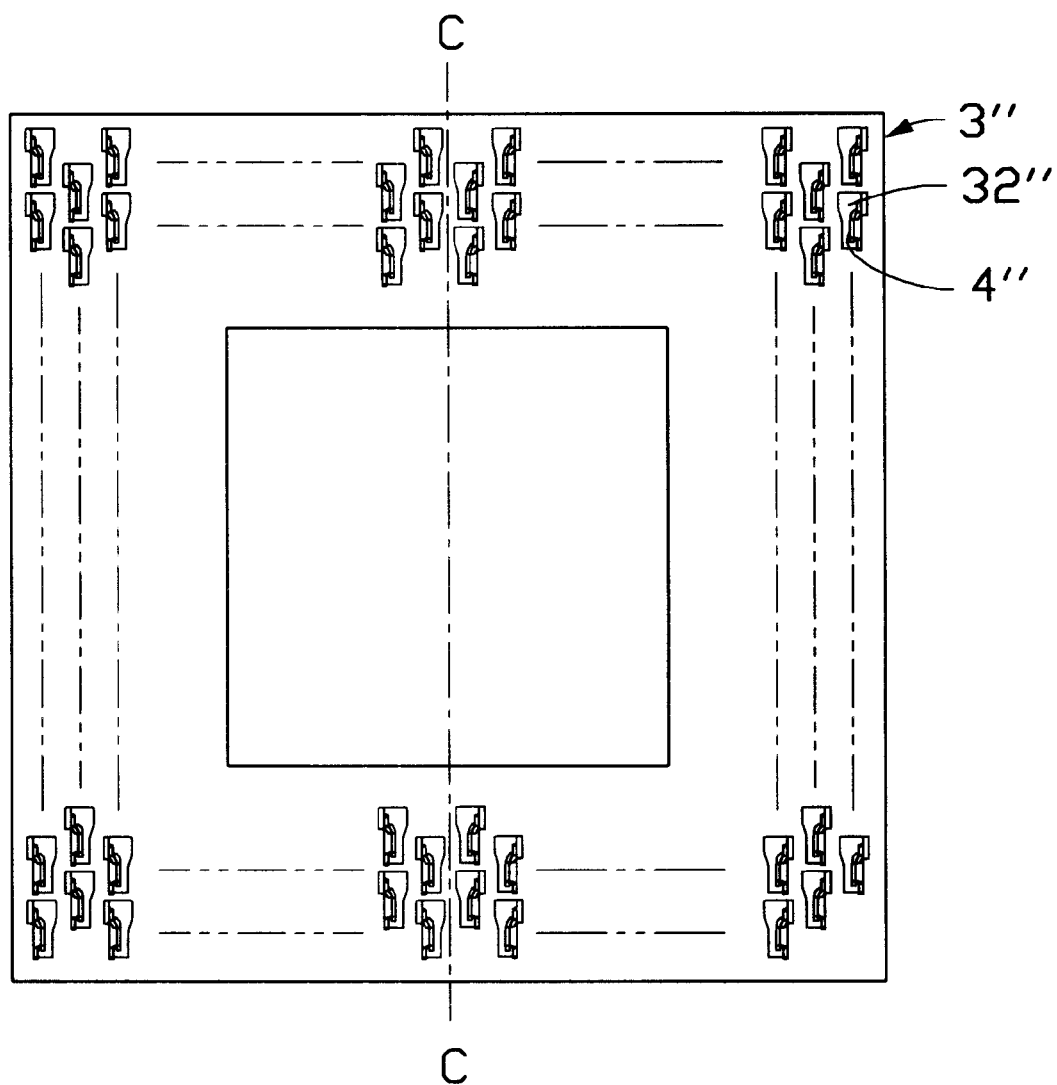
FIG. 9 is a top view of a socket base of a connector constructed in accordance with a third embodiment of the present invention.

FIG. 9 shows a third embodiment of the present invention, wherein the base of the connector which is now designated by reference numeral 3" has a central base reference line C which divides the rows of pin receiving holes 32" into two groups for receiving terminals 4" therein. The rows of pin receiving holes 32" and the terminals 4" received therein are arranged to have a symmetrical orientation with respect to the base reference line C. Thus, the transverse engaging forces acting upon the pins 7 by the terminals 4" counteract each other thereby substantially eliminating the transverse force acting upon the cover 1 and the chip.

Although the present invention has been described with reference to preferred embodiments, it is apparent to those skilled in the art that a variety of modifications and changes may be made without departing from the scope of the present invention which is intended to be defined by the appended claims

What is claimed is:

1. An electrical connector comprising a base defining a plurality of pin receiving holes therein adapted to receive conductive pins of an electronic device mounted to the connector, each pin receiving hole defining a passageway through which the pin is moveably, a conductive terminal member being fixedly in each pin receiving holes and engageable with the corresponding pin, the pin receiving holes being divided into a first group and a second group;

the terminal members of the first group being located at a first side of the passageway and the terminal members of the second group being located at an opposite, second side whereby the first group of terminal members engage the corresponding pins at the first sides, while the second group of terminal members engage the corresponding pins at the opposite second sides;

wherein each pin receiving hole has an expanded section and a reduced section, the passageway being defined between the expanded section and the reduced section, the terminal member being positioned in the reduced section, the pin being initially received in the expanded section and then moved to the reduced section via the passageway to engage with the terminal member;

wherein the terminal member has an inclined resilient section which deforms upon engaging with the pin thereby imparting a transverse engaging force thereon, wherein the transverse engaging forces of the pins in the first and second groups of pin receiving holes are counteracted by each other and thus substantially eliminated;

wherein a cover is slidably positioned on the base and defining through holes through which the pins of the electronic device extend before being received in the corresponding pin receiving holes of the base, the cover being movable with respect to the base to drive the pins of the electronic device to move within the passageways; and wherein a lever is mounted on the base and engaging with the cover for driving the cover to move with respect to the base.

2. The electrical connector as claimed in claim 1, wherein the pin receiving holes are arranged in a plurality of rows, the first and second groups of pin receiving holes being alternately arranged in rows.

3. The electrical connector as claimed in claim 1, wherein the pin receiving holes are arranged in a plurality of rows, the first and second groups of pin receiving holes being alternately arranged in two rows.

4. The electrical connector as claimed in claim 1, wherein the pin receiving holes are arranged in a plurality of rows, the first and second groups of pin receiving holes being respectively arranged in opposite halves of the base.

5. The electrical connector as claimed in claim 1, wherein each pin receiving hole has two opposite inside faces between which the passageway is defined, and wherein the terminal members of the first group of pin receiving holes are fixed to one of the inside faces while the terminal members of the second group of pin receiving holes are fixed to the other of the inside faces.

* * * * *